United States Patent [19]
Lyu et al.

[11] Patent Number: 5,998,229
[45] Date of Patent: Dec. 7, 1999

[54] METHODS OF MANUFACTURING THIN FILM TRANSISTORS AND LIQUID CRYSTAL DISPLAYS BY PLASMA TREATMENT OF UNDOPED AMORPHOUS SILICON

[75] Inventors: Chun-Gi Lyu; Mun-Pyo Hong, both of Kyungki-do; Sang-Gab Kim, Seoul, all of Rep. of Korea

[73] Assignee: Samsung Electronics Co., Ltd., Rep. of Korea

[21] Appl. No.: 09/017,202

[22] Filed: Feb. 2, 1998

[30] Foreign Application Priority Data

Jan. 30, 1998 [KR]  Rep. of Korea .................. 98-2586

[51] Int. Cl.[6] .................................................. H01L 21/00
[52] U.S. Cl. .............................. 438/30; 438/158; 438/159
[58] Field of Search ..................................... 438/158, 159, 438/162, 30

[56] References Cited

U.S. PATENT DOCUMENTS

| | | |
|---|---|---|
| 5,362,660 | 11/1994 | Kwasnick et al. ................... 437/40 |
| 5,530,265 | 6/1996 | Takemura ................... 257/86 |
| 5,532,180 | 7/1996 | Den Boer et al. ................... 437/40 |
| 5,661,050 | 8/1997 | Den Boer et al. ................... 438/30 |
| 5,728,610 | 3/1998 | Gosain et al. ................... 438/162 |
| 5,872,021 | 2/1999 | Matsumoto et al. ................... 438/30 |
| 5,874,326 | 2/1999 | Lyu ................... 438/158 |
| 5,917,199 | 6/1999 | Byun et al. ................... 257/79 |

*Primary Examiner*—John F. Niebling
*Assistant Examiner*—Michael S. Lebentritt
*Attorney, Agent, or Firm*—Myers Bigel Sibley & Sajovec

[57] ABSTRACT

Plasma treatment is performed on an exposed portion of an undoped amorphous silicon layer in a thin film transistor, after etching source/drain contacts and a doped amorphous silicon layer. The plasma treatment can repair damage caused during the etching. The plasma treatment is preferably a hydrogen plasma treatment, and more preferably a helium plasma treatment. These treatments are particularly useful in repairing damage when the source/drain electrodes comprise molybdenum or molybdenum/tungsten alloy, and etching is performed by dry etching the doped amorphous silicon layer using $CF_4$ and HCl gases.

20 Claims, 17 Drawing Sheets

FIG.9

| Fluoride | Temperature(°C) | Chloride | Temperature(°C) |
|---|---|---|---|
| $WF_6$ | 20 | $WCl_6$ | 345 |
| $WOF_4$ | 190 | $WOCl_4$ | 230 |
| $MoF_6$ | 35 | $MoCl_5$ | 270 |
| $MoOF_4$ | 180 | $MoOCl_4$ | 180 |
| $TiF_4$ | 385(s) | $TiCl_4$ | 135 |
| $TaF_5$ | 230 | $TaCl_5$ | 240 |
| $SiF_4$ | −85 | $SiCl_4$ | 60 |
| $AlF_3$ | 1290(s) | $AlCl_3$ | 180(s) |

FIG.10

| W content (atm%) | Cl2+SF6 | HCl+SF6 |
|---|---|---|
| 0% | 200 Å/min | 150 Å/min |
| 0% − 10% | 243 Å/min | 261 Å/min |
| 10% − 20% | 592 Å/min | 280 Å/min |
| 20% − 30% | 604 Å/min | 313 Å/min |

W content

FIG.19

| Condition | Condition for P.R | Condition for etching the n+α-silicon | | Etched thickness(Å) |
|---|---|---|---|---|
| | | Etching | Ashing | |
| 1 | Etching the n+α-silicon after P,R strip | Etching+He Plasma | × | 1283 |
| 2 | | Etching(CF$_4$+HCL)+ He Plasma | Ashing | 1289 |
| 3 | | Etching(CF$_4$+HCL) | Ashing+ in_situ He Plasma | 1154 / 1167 |
| 4 | Etching the n+α-silicon with P,R Lovering | Etching | Ashing | 1166 |
| 5 | | Etching(CF$_4$+HCL) | Ashing+ H$_2$ Plasma | 1114 / 1114 |
| 6 | | Etching(CF$_4$+HCL) | Ashing+ in_situ He Plasma | 1211 |

FIG. 20

| Condition | Ioff(pA) | Ion($\mu$A) | Vth(V) | Grad | Contact Resistance (k$\Omega$) | Resistance (k$\Omega$) |
|---|---|---|---|---|---|---|
| 1 | 0.2 | 2.7 | 3.01 | 113 | 8.18 | 2.20 |
| 2 | 0.08 | 2.95 | 2.88 | 117 | 8.60 | 2.23 |
|   | 0.24 | 2.83 | 2.84 | 115 | 9.02 | 2.23 |
|   | 0.26 | 3.01 | 2.82 | 119 | 9.99 | 2.24 |
|   | 0.18 | 2.85 | 2.97 | 116 | 8.62 | 2.19 |
| 3 | 0.51 | 3.37 | 2.48 | 127 | 9.58 | 2.20 |
|   | 0.63 | 3.28 | 2.48 | 125 | 8.68 | 2.19 |
| 4 | 5.68 | 4.02 | 2.59 | 142 | 17.2 | 2.19 |
|   | 1.27 | 3.97 | 2.75 | 141 | 23.4 | 2.19 |
| 5 | 0.24 | 3.67 | 2.84 | 133 | 25.4 | 2.17 |
| 6 | 0.64 | 4.11 | 2.49 | 144 | 65.8 | 2.19 |
|   | 0.57 | 4.28 | 2.53 | 146 | 37.7 | 2.18 |
|   | 0.68 | 4.21 | 2.59 | 145 | 25.6 | 2.18 |

FIG. 21

| condition | Gate ACICD | S/D ACICD | Cap | Area (μm²) | Cj (F/cm²) | designed W | designed L | Actual W | Actual L | Mobility |
|---|---|---|---|---|---|---|---|---|---|---|
| 1 | 9.231 | 8.847 | 80.9 | 498713.28 | $1.56*10^{-8}$ | 14 | 3.5 | 12.847 | 4.653 | 0.570 |
|  |  |  | 77.85 | 498713.28 | $1.56*10^{-8}$ |  |  |  |  | 0.644 |
|  |  |  | 77.75 | 498713.28 | $1.56*10^{-8}$ |  |  |  |  | 0.614 |
| 2 | 9.231 | 8.847 | 77.06 | 498713.28 | $1.56*10^{-8}$ |  |  | 12.847 | 4.653 | 0.664 |
|  |  |  | 76.91 | 498713.28 | $1.56*10^{-8}$ |  |  |  |  | 0.638 |
|  |  |  | 77.68 | 498713.28 | $1.56*10^{-8}$ |  |  |  |  | 0.750 |
| 3 | 9.231 | 8.847 | 77.27 | 498713.28 | $1.56*10^{-8}$ |  |  | 12.847 | 4.653 | 0.731 |
|  |  |  | 76.08 | 498521.21 | $1.56*10^{-8}$ |  |  |  |  | 0.951 |
| 4 | 9.095 | 8.847 | 77.72 | 498521.21 | $1.56*10^{-8}$ |  |  | 12.870 | 4.630 | 0.918 |
| 5 | 9.095 | 8.847 | 79.01 | 498521.21 | $1.56*10^{-8}$ |  |  | 12.870 | 4.630 | 0.803 |
|  |  |  | 78.87 | 498521.21 | $1.56*10^{-8}$ |  |  |  |  | 0.942 |
| 6 | 9.095 | 8.87 | 79.57 | 498521.21 | $1.56*10^{-8}$ |  |  | 12.870 | 4.630 | 0.961 |
|  |  |  | 80.45 | 498521.21 | $1.56*10^{-8}$ |  |  |  |  | 0.937 |

METHODS OF MANUFACTURING THIN FILM TRANSISTORS AND LIQUID CRYSTAL DISPLAYS BY PLASMA TREATMENT OF UNDOPED AMORPHOUS SILICON

FIELD OF THE INVENTION

The present invention relates to microelectronic device manufacturing methods, and more specifically to methods of manufacturing thin film transistors and liquid crystal display patterns.

BACKGROUND OF THE INVENTION

Liquid Crystal Displays (LCDs) are widely used flat panel display devices. As is well known to those having skill in the art, an LCD generally includes two spaced apart substrates with liquid crystals therebetween. A plurality of spaced apart gate lines are formed on one substrate, and a plurality of spaced apart data lines are formed on the substrate that intersect the plurality of spaced apart gate lines. Accordingly, the gate lines and data lines define an array of pixels. An array of pixel electrodes is provided, a respective one of which is in a respective one of the pixels. An array of thin film transistors is also provided, each comprising a gate electrode that is connected to one of the spaced apart gate lines, a gate insulator on the gate electrode, and an amorphous silicon layer on the gate insulator. Spaced apart source and drain electrodes are provided on the amorphous silicon layer. The source electrode is connected to one of the spaced apart data lines. The drain electrode overlaps a pixel electrode, and is electrically connected thereto through a contact hole therebetween.

As is well known to those having skill in the art, the thin film transistors generally include an undoped hydrogenated amorphous silicon layer that forms the channel region. A doped hydrogenated amorphous silicon layer that may be heavily doped, for example, with n-type impurities, is formed on the undoped amorphous silicon layer. The doped amorphous silicon layer can decrease the contact resistance between the amorphous silicon layer and source/drain electrodes. The doped amorphous silicon layer is then selectively etched using patterned source/drain electrodes as an etch mask. However, the source/drain electrodes may also be undesirably etched during etching of the doped amorphous silicon layer.

In order to reduce etching of the source/drain electrodes, a photoresist pattern that is used to form the source/drain electrodes may also be used as an etch mask to etch the doped amorphous layer. The photoresist pattern is then stripped. Unfortunately, however, the amorphous silicon layer may be damaged when stripping the hardened photoresist pattern. This may degrade the performance of the thin film transistors and liquid crystal displays.

SUMMARY OF THE INVENTION

It is therefore an object of the present invention to provide improved methods of manufacturing thin film transistors and liquid crystal displays.

It is another object of the present invention to provide methods of manufacturing thin film transistors and liquid crystal displays that can reduce damage to the undoped amorphous silicon layer during subsequent processing steps.

These and other objects are provided, according to the present invention, by performing plasma treatment on an exposed portion of an undoped amorphous silicon layer in a thin film transistor, after etching source/drain contacts and a doped amorphous silicon layer. The plasma treatment can repair damage caused during the etching. The plasma treatment is preferably a hydrogen plasma treatment, and more preferably a helium plasma treatment. These treatments are particularly useful in repairing damage when the source/drain electrodes comprise molybdenum or molybdenum/tungsten alloy, and etching is performed by dry etching the doped amorphous silicon layer using $CF_4$ and HCl gases.

More specifically, thin film transistors are manufactured, according to the invention, by forming on a substrate, a gate electrode, a gate insulating layer on the gate electrode, an undoped amorphous silicon layer on the gate insulating layer, first and second spaced apart doped amorphous silicon layers on the undoped amorphous silicon layer that define an exposed portion of the undoped amorphous silicon layer, a first electrode on the first doped amorphous silicon layer and a second electrode on the second doped amorphous silicon layer. Plasma treatment is then performed on the exposed portion of the undoped amorphous silicon layer. After plasma treatment, a passivation layer is formed on the first and second electrodes and on the plasma-treated exposed portion of the undoped amorphous silicon layer.

The plasma treatment is preferably a hydrogen plasma treatment, and more preferably helium plasma treatment. Most preferably, in situ heat helium plasma treatment is preferred.

In a first embodiment, the thin film transistor is formed by forming a doped amorphous silicon layer on the undoped amorphous silicon layer and forming the first and second electrodes on the doped amorphous silicon layer. The doped amorphous silicon layer is then dry etched using the first and second electrodes as an etch mask, to form the first and second spaced apart doped amorphous silicon layers on the undoped amorphous silicon layer that define the exposed portion of the undoped amorphous silicon layer. The first and second electrodes preferably comprise molybdenum or molybdenum/tungsten alloy, and the dry etching is preferably performed using $CF_4$ and HCl gases.

According to a second embodiment, first and second electrodes are formed by forming a conductive layer on the doped amorphous silicon layer, forming a photoresist pattern on the conductive layer, and etching the conductive layer using the photoresist pattern as an etch mask to form the first and second electrodes. The photoresist pattern is then stripped.

In a third embodiment, the thin film transistor is formed by forming a doped amorphous silicon layer on the undoped amorphous silicon layer and forming a conductive layer on the doped amorphous silicon layer. A photoresist pattern is formed on the conductive layer. The conductive layer is etched using the photoresist pattern as an etch mask to form the first and second electrodes. The doped amorphous silicon layer is dry etched using the photoresist pattern as an etch mask, to form the first and second spaced apart doped amorphous silicon layers on the undoped amorphous silicon layer that define an exposed portion of the undoped amorphous silicon layer. The conductive layer can be etched and the doped amorphous silicon layer can be dry etched using a single dry etching system. Then, the photoresist pattern is stripped.

An array of thin film transistors as described above may be included in a liquid crystal display. The liquid crystal display includes a plurality of spaced apart gate lines on a substrate, and an array of gate electrodes, a respective one of which extends from one of the gate lines. A gate insulating layer is provided on the gate electrodes and an undoped amorphous silicon layer is provided on the gate insulating layer. An array of first and second spaced apart doped amorphous silicon layers is on the undoped amorphous silicon layer, a respective pair of which define an array of exposed portions of the undoped amorphous silicon layer. An array of spaced apart data lines intersect the array of spaced apart data lines. An array of source electrodes is provided, a respective one of which is on a respective first doped amorphous silicon layer and is connected to one of the data lines. An array of drain electrodes is also provided, a respective one of which is on a respective second doped amorphous silicon layer. Plasma treatment is performed on the array of exposed portions of the undoped amorphous silicon layer.

The plasma treatment and the various embodiments of forming a thin film transistor may be performed as described above. Accordingly, high performance thin film transistors and liquid crystal displays may be provided, the undoped amorphous silicon layers of which need not degrade during etching.

BRIEF DESCRIPTION OF THE DRAWINGS

FIG. 9 is a table showing volatile and sublimation temperatures of refractory metal halides at atmospheric pressure (1 atm).

FIG. 10 is a table showing the etch rages of a molybdenum/tungsten alloy (MoW) layer for various dry etching gas systems according to a first embodiment of the present invention.

FIG. 19 is a table showing manufacturing methods according to the second embodiment and the etch rates of the doped amorphous silicon layer.

FIG. 20 is a table showing the results of the Electric Data System (EDS) test of a TFT according to the second embodiment.

FIG. 21 is a table showing the mobility calculated using the EDS data according to the second embodiment.

DETAILED DESCRIPTION OF PREFERRED EMBODIMENTS

Figure 1:
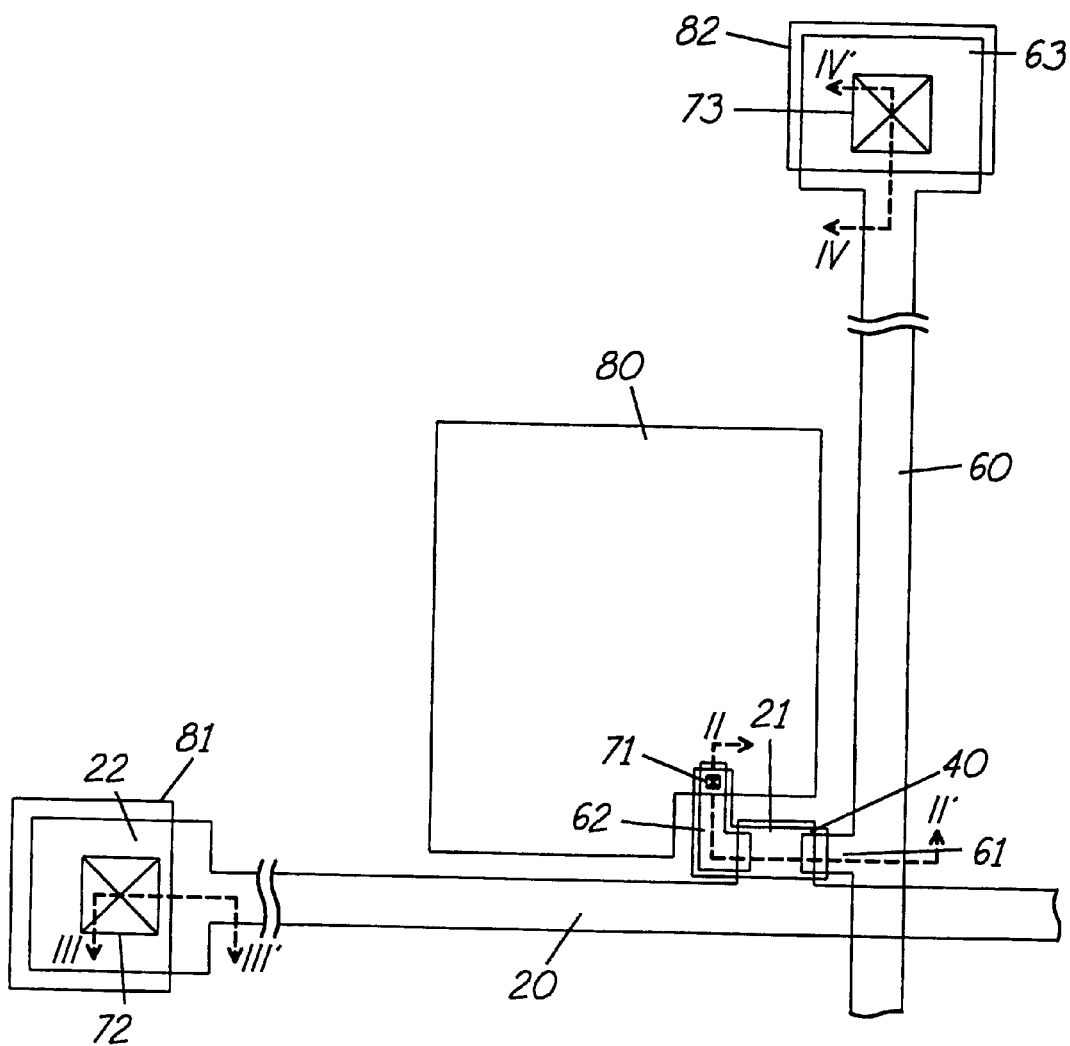
FIG. 1 is a plan view of Thin Film Transistor (TFT) substrates according to a first embodiment of the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

Figure 2:
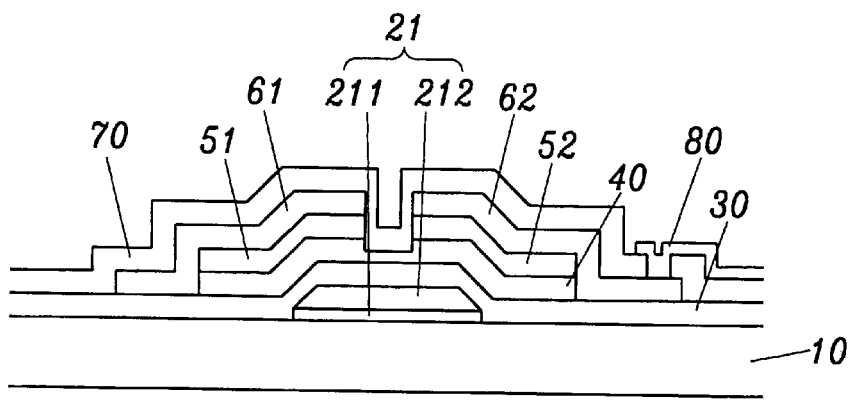
FIGS. 2–4 are cross-sectional views of a TFT substrate shown in FIG. 1, taken along the lines II–II', III–III', IV–IV' respectively.
Figure 3:
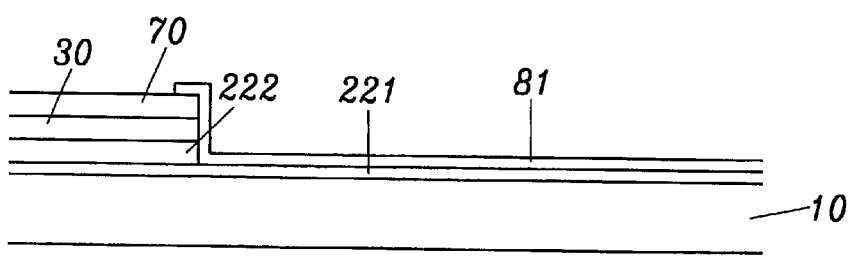
Figure 4:
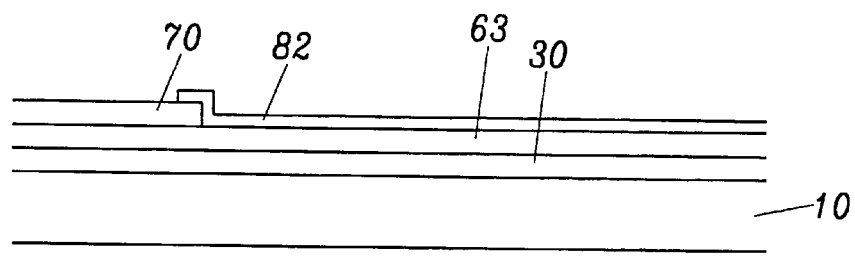

A TFT and LCD substrate according to a first embodiment of the present invention will be described. It will be understood that an LCD includes an array of interconnected TFTs. FIG. 1 is plan view of a TFT substrate according to a first embodiment of the present invention. FIGS. 2–4 show cross-sectional views of the TFT substrate shown in FIG. 1 taken along the lines II–II', III–III', IV–IV', respectively.

A gate pattern, including a gate line 20, a gate electrode 21 which is a branch of the gate line 20, and a gate pad 22 which is formed at the end of the gate line 20, is formed on a substrate 10. The gate electrode 21 and the gate pad 22 include lower layers 211, 221 made of chromium and upper layers 212, 222 made of aluminum-neodymium alloy. The upper layer 222 of the gate pad 22 made of aluminum-neodymium alloy is removed. The gate line 20 may also include a chromium layer and an aluminum-neodymium alloy layer. The gate pad 22 transmits scanning signals to the gate line 20 from external of the LCD.

A gate insulating layer 30 is formed over the gate pattern 20, 21 and 22, and the gate insulating layer 30 has a contact hole 72 exposing the lower layer 221 of the gate pad 22. A hydrogenated amorphous silicon layer is formed on the gate insulating layer 30 over the gate electrode 21, and a heavily doped n+ hydrogenated amorphous silicon layer 51 and 52 is formed on the amorphous silicon layer 40 and divided into two spaced apart portions with respect to the gate electrodes 21.

A data line 60 is formed longitudinally on the gate insulating layer 30, and a data pad 63 which is formed at the end of the data line 60, transmits display signals from external of the LCD to the data line 60. A source electrode 61, which is a branch of the date line 60, is formed on the one portion 51 of the doped amorphous silicon layer, and a drain electrode 62 is formed on the other portion 52 of the doped amorphous silicon layer to define an exposed portion of the undoped amorphous silicon layer therebetween. A data pattern including the data line 60, the source and the drain electrodes 61 and 62 and the data pad 63 is preferably made of molybdenum-tungsten alloy.

A passivation layer 70 is formed on the data pattern 60, 61, 62 and 63 and on the amorphous silicon layer 50 which is not covered with the data pattern. The passivation layer 70 and the gate insulating layer 30 have contact holes 72, 71, 73 exposing the lower layer 221 of the gate pad 22, the drain electrode 62 and the data pad 63, respectively.

An Indium Tin Oxide (ITO) pixel electrode 80 is formed on the passivation layer 70 and connected to the drain electrode 62 through the contact hole 71. Also formed are an ITO electrode 81 for the gate pad connected to the exposed lower layer 221 of the gate pad 22, and an ITO electrode 82 for the data pad connected to the data pad 63 and transmitting the data signal to the data line 60.

A manufacturing method of the TFT substrate shown in FIGS. 1–4 will be described. FIGS. 5A–8C are cross-sectional views illustrating a manufacturing method according to a first embodiment of the present invention. The capital letters A, B and C following Arabic numerals in the view numbers show the TFT, the gate pad and the data pad regions, respectively. A manufacturing method according to the first embodiment can use 5 masks.

Figure 5A:
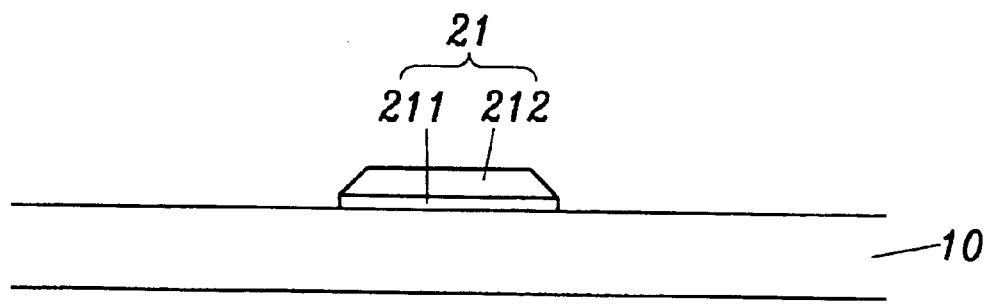
FIGS. 5A–8C are cross-sectional views illustrating manufacturing methods of a TFT substrate shown in FIG. 1 according to a first embodiment of the present invention.
Figure 5B:
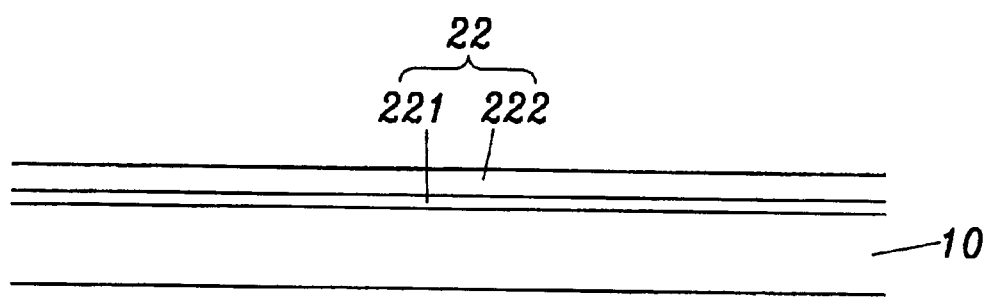
Figure 5C:
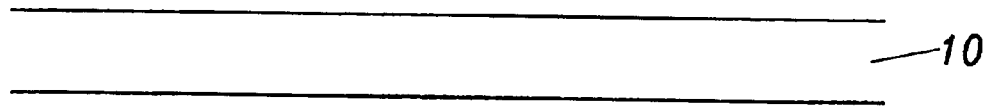

First, as shown in FIGS. 5A–5C, a chromium layer and an aluminum-neodymium alloy layer are deposited in sequence. The double layers are photo etched using a first mask to form a gate pattern including a gate line 20, a gate electrode 21 and a gate pad 22.

The gate pattern may be a single layer of molybdenum, molybdenum-tungsten alloy, or have a double layered structure including a first layer of aluminum and aluminum alloy and a second layer of molybdenum, molybdenum-tungsten alloy or a first layer of chromium and a second layer of aluminum. Other structures may also be used.

Figure 6A:
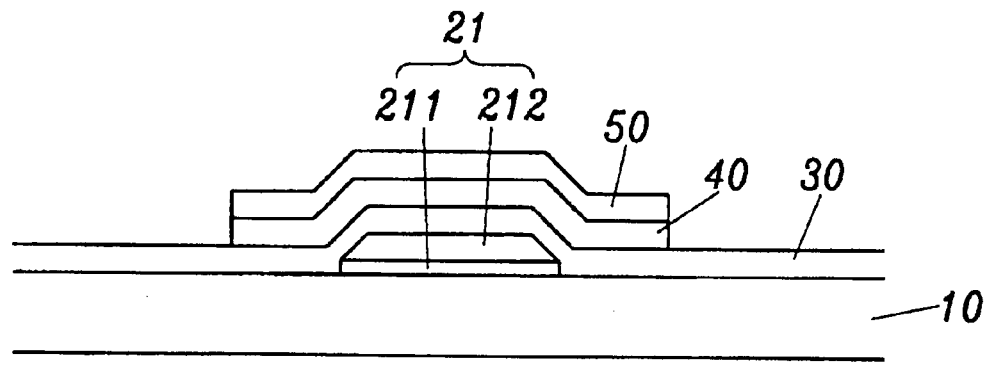
Figure 6B:
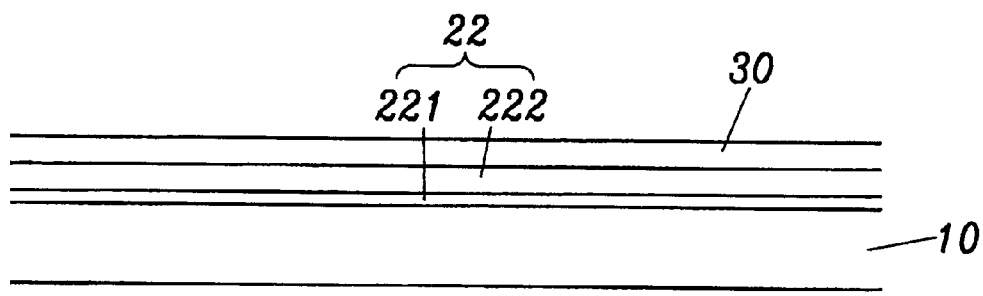
Figure 6C:
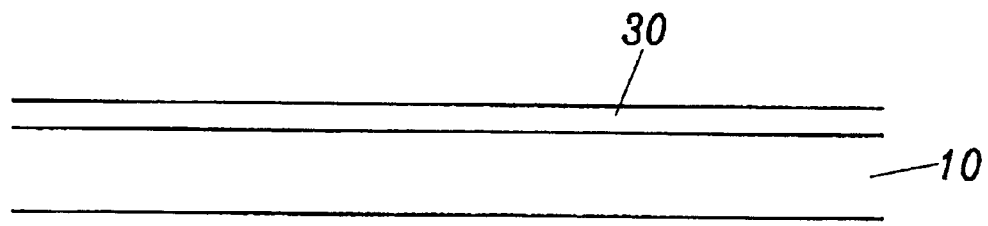

As shown in FIG. 6A, a gate insulating layer 30 made of silicon nitride, an undoped hydrogenated amorphous silicon layer 40 and a heavily doped n+ hydrogenated amorphous silicon layer 50 are deposited in sequence. The doped amorphous silicon layer 50 and the undoped amorphous silicon layer 40 are photo etched using a second mask. As shown in FIGS. 6B and 6C, the gate pad and the data pad region are covered by the gate insulating layer 30.

Figure 7A:
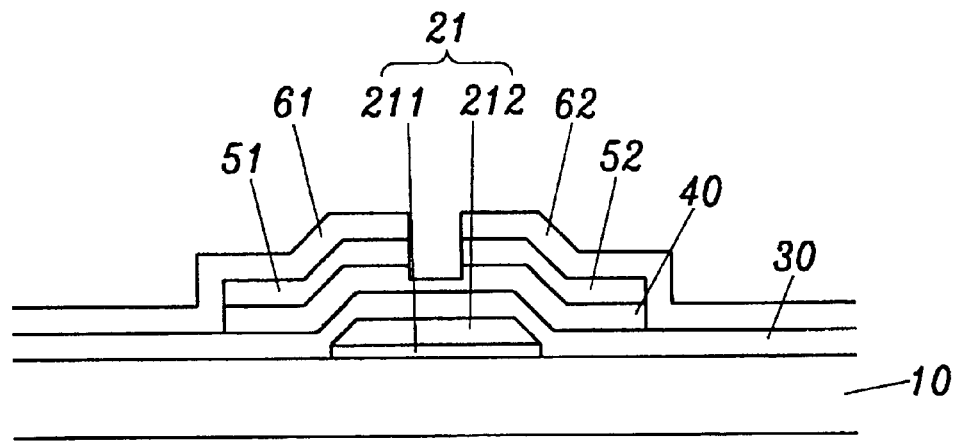
Figure 7B:
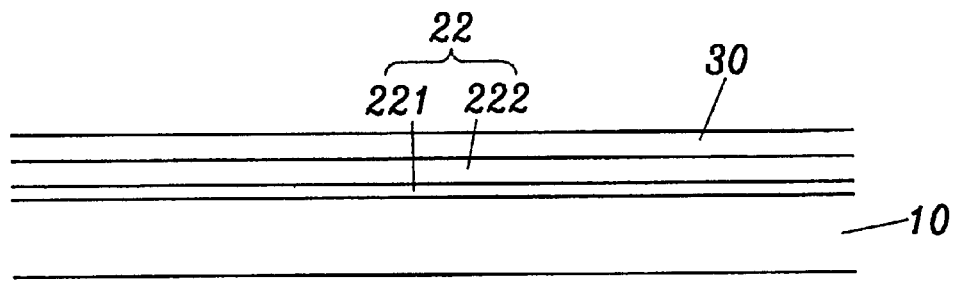
Figure 7C:
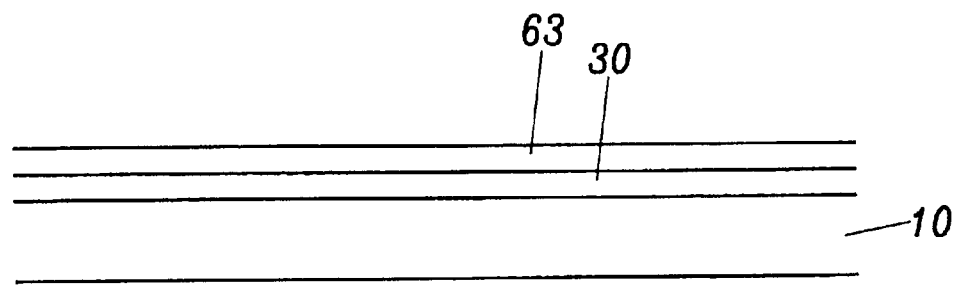

As shown in FIGS. 7A–7C, a molybdenum or a molybdenum-tungsten alloy layer is deposited on the doped amorphous silicon layer 50 and etched using a third mask to form a data pattern including a data line 60, a source and a drain electrode 61 and 62 and a data pad 63. The data pattern may be formed using chromium, tantalum or other conductive materials, and may have a double layered structure of a chromium layer and one of a molybdenum layer and a molybdenum-tungsten alloy layer. Other structures may also be used.

The exposed portion of the doped amorphous silicon layer 50 is plasma dry etched using the source and the drain electrodes 61 and 62 as an etch mask. This etching divides the doped amorphous silicon layer into two spaced apart portions and exposes the amorphous silicon layer 40 between the two portions of the doped amorphous silicon layer 51 and 52.

If the data pattern is made of molybdenum or molybdenum-tungsten alloy, the dry etching gas for the doped amorphous silicon layer 50 may consume the molybdenum or molybdenum-tungsten alloy layer. Therefore, the dry etching gas should be selected so that the etch rate of molybdenum or molybdenum-tungsten alloy is preferably equal to or less than 100 Å/min. A gas system including a hydrogen halide and at least one gas selected from $CF_4$, $CHF_3$, $CHClF_2$, $CH_3F$ and $C_2F_6$ is preferable. More preferable is an $HCl+CF_4$ gas system.

FIG. 9 is a table showing volatile and sublimation temperatures of refractory metal halides under atmospheric pressure (1 atm). FIG. 10 is a table showing the etch rates of the molybdenum and the molybdenum-tungsten alloy for two dry etching gas systems according to a first embodiment of the present invention. An added "(s)" in FIG. 9 indicates the sublimation temperature.

In the step of etching the doped amorphous silicon layer using the source/drain electrodes as an etch mask, a gas system of fluoride gas ($SF_6$, $CF_4$, etc.) and chloride gas (HCl, $Cl_2$, etc.) may be used in order to obtain a sufficient etch rate for the doped hydrogenated amorphous silicon and the hydrogenated amorphous silicon and to obtain proper selectivity between the amorphous silicon layer and the gate insulating layer which is not covered with the amorphous silicon layer and which comprises silicon nitride. However, as shown in FIG. 9, since halides ($WF_6$, $WCl_5$, $MoF_6$, $MoCl_5$) or oxygen halides ($WOF_4$, $WOCl_4$, $MoOF_4$, $MoOCl_4$) of refractory metals such as molybdenum or tungsten have low volatile or sublimation temperatures, a large portion of molybdenum or molybdenum-tungsten alloy may be consumed when the amorphous silicon is etched. On the other hand, the volatile temperatures (−85°, 60°) of the silicon halides ($SiF_4$, $SiCl_4$) are very low and the sublimation temperatures (1290°, 180°) of the aluminum halides ($AlF_3$, $AlCl_3$) are relatively high.

As shown in FIG. 10, the molybdenum or the molybdenum-tungsten alloy layer of data pattern 61, 62 is etched at a rate of 300–610 Å/min for a $HCl+SF_6$ gas system at a rate of 150–320 Å/min for a $Cl_2+SF_6$ gas system Hydrogenated amorphous silicon may form a volatile material both under the fluorine (F) or chlorine (Cl) plasma process. However, as shown in FIG. 9, in the case of molybdenum-tungsten alloy, the volatile temperatures of the fluorides ($MoF_6$, $MoOF_4$, $WF_6$, $WOF_4$) are low and those of the chlorides ($MoCl_5$, $MoOCl_4$, $WCl_6$, $WOCl_4$) are relatively high. Therefore, the molybdenum-tungsten alloy may be damaged under a fluoride (especially $SF_6$) plasma process.

Moreover, as shown in FIG. 10, the etch rate may increase as the tungsten content in molybdenum-tungsten alloy is increased. The etch rate may increase as the tungsten contents in molybdenum-tungsten alloy is increased because the volatile temperature of the tungsten fluoride ($WF_6$) is lower than that of the molybdenum fluoride ($MoF_6$). The etch rate using the $SF_6+Cl_2$ gas system is a little faster than the $SF_6+HCl$ gas system, because $Cl_2$ can make more chlorine ions than HCl. However, since polymerization does not occur as much when $SF_6$ gas is used as a source of fluorine ion, large amounts of molybdenum-tungsten alloy may be consumed for two gas systems.

Figure 11:
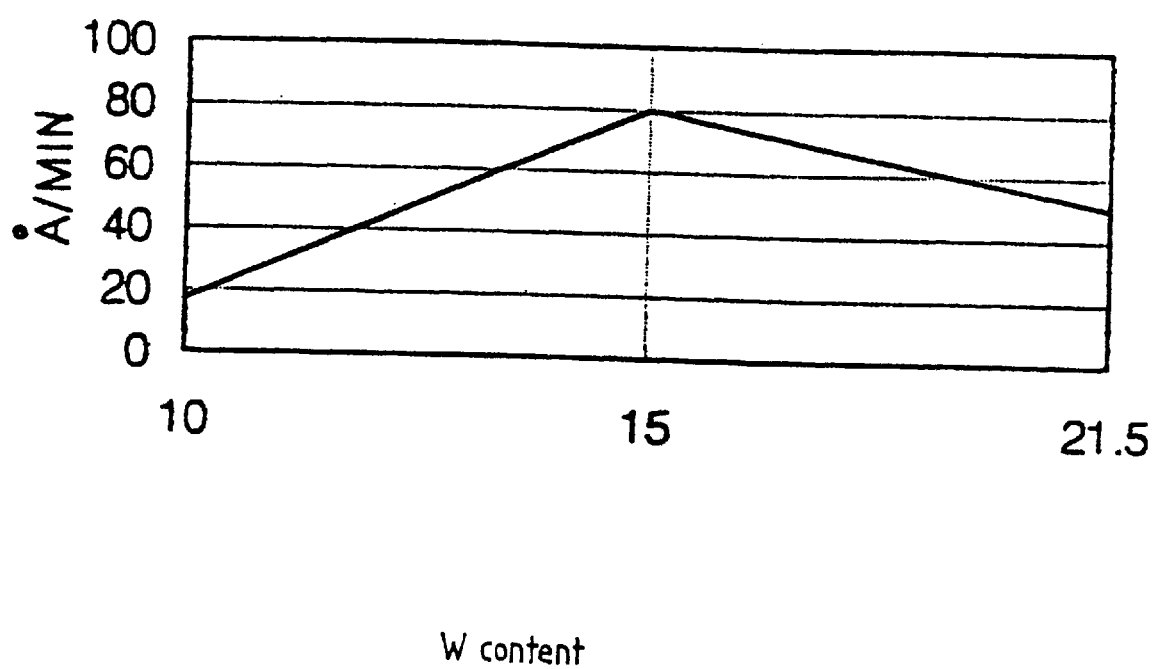
FIG. 11 is a graph illustrating an etch rate of the MoW layer for another dry etching gas system according to the first embodiment of the present invention.

On the other hand, the etch rate of molybdenum-tungsten alloy (MoW) may be decreased for a $CF_4+HCl$ gas system. FIG. 11 is a graph illustrating the etch rate of MoW for a $CF_4+HCl$ gas system as a function of tungsten content. The condition for dry etching was a pressure of 80 pascal, a power of 800 W and a flux of the mixed gases of 500 sccm.

As shown in FIG. 11, the molybdenum alloy layer of data pattern 61 and 62 is etched at a rate of 15–80 Å/min when a $CF_4+HCl$ gas system is used. Compared to the results of FIG. 10, this etch rate is relatively small. The slow etch may be obtained because the H ion of HCl decreases the density of the fluorine which is the main source for etching the molybdenum-tungsten alloy. Moreover, the polymerization effect that absorbs the fluorocarbon polymer film [—(CF) n—] to the surface may also increase to reduce the etch rate. In general, the etch rate for $CF_4$ gas is smaller than that for $SF_6$. If appears that the $SF_6$ makes more free fluorine ions than the $CF_4$ gas in the same ionization condition. Especially, when the $CF_4$ gas is mixed with the HCl gas, the fluorocarbon polymer film is readily formed. Since the molybdenum-tungsten alloy is etched when the amount of fluorine is very large compared with that of carbon, the etch rate abruptly decreases.

Figure 12:
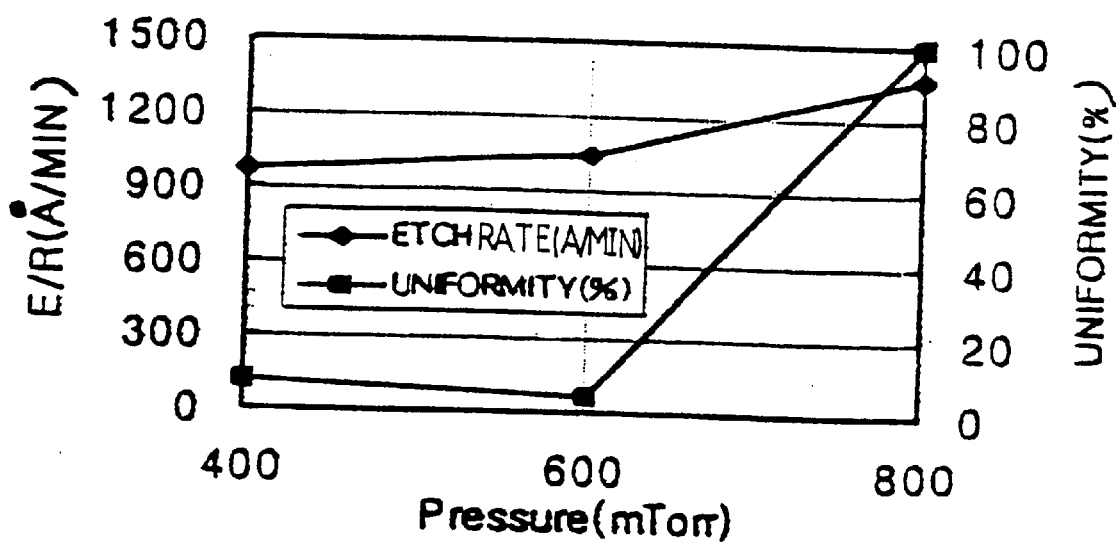
FIGS. 12–14 are graphs showing etch rates and uniformity as a function of the pressure, power and flux of the gas, respectively.
Figure 13:
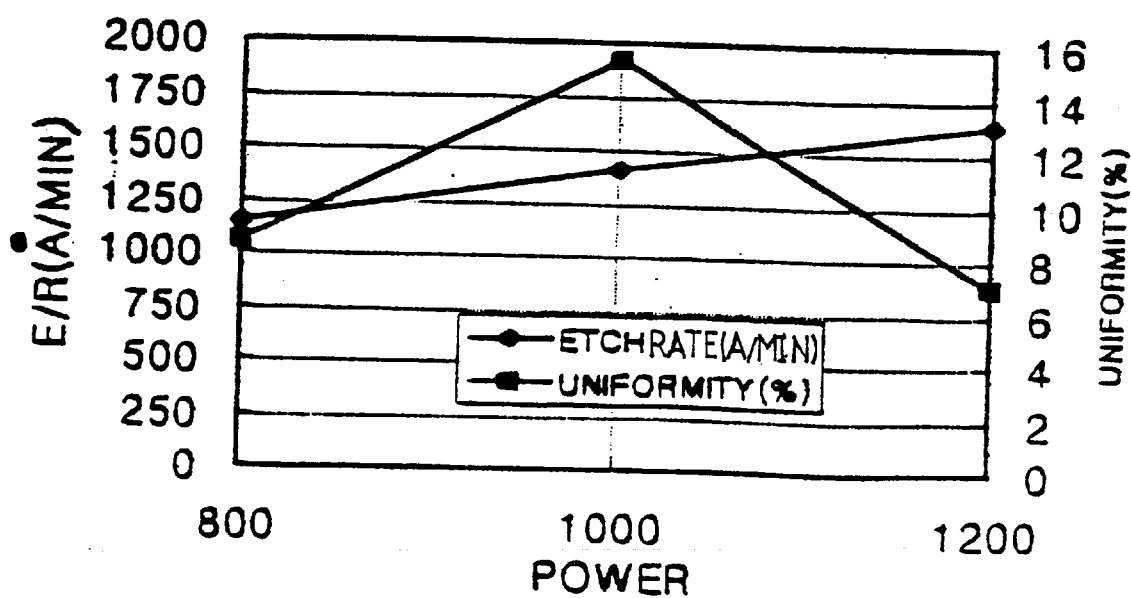
Figure 14:
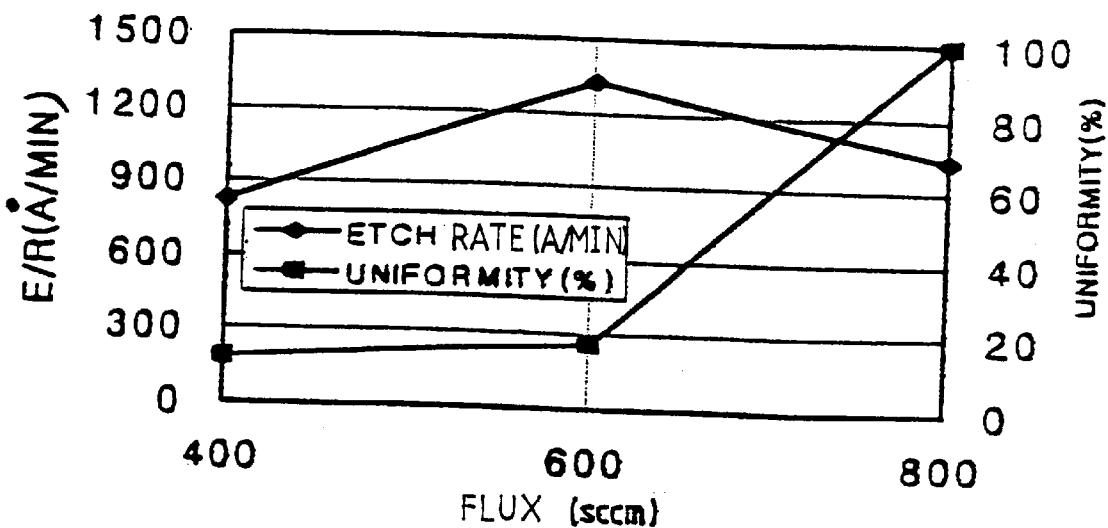

FIGS. 12–14 are graphs showing the etch rates and the uniformity as a function of pressure, power and flux of the gas.

FIG. 12 is a graph showing the etch rate and the uniformity as a function of pressure. As shown, the etch rate increases as the pressure increases and uniformity may be obtained at a pressure of 800 mTorr.

FIG. 13 is a graph showing the etch rate and the uniformity as a function of power. As shown, the etch rate also increases as the power increases and uniformity is a maximum when the power is 1.000 W.

FIG. 14 is a graph showing the etch rate and uniformity as a function of flux of the mixed gas. As shown, the uniformity increases as the flux increases and the etch rate is a maximum when the flux is 600 sccm.

From the above-described results, if $CF_4$ +HCl gas is used to etch the doped amorphous silicon layer, the consumption of the data pattern made of the molybdenum-tungsten alloy may be equal to or less than 50 Å during the step of etching the doped amorphous silicon layer.

Figure 15:
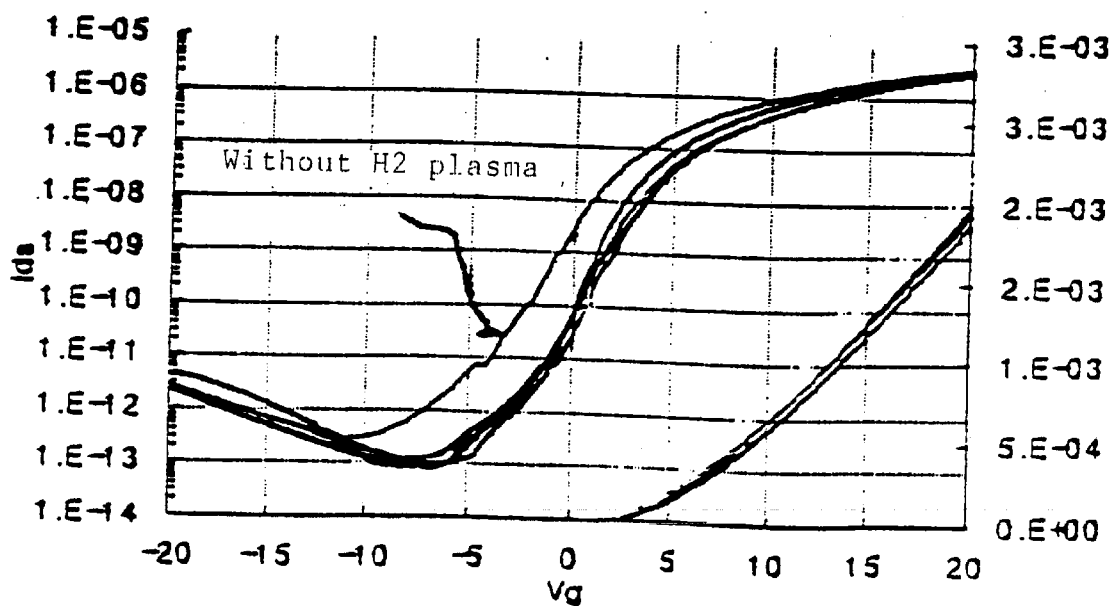
FIG. 15 is a graph illustrating current-voltage (I–V) characteristics of a TFT before and after a hydrogen ($H_2$) plasma treatment.

FIG. 15 is a graph illustrating the I–V characteristics of a TFT after etching the doped amorphous silicon layer using the $CF_4$+HCl gas system. Off state current Ioff is at least 10 pA at a gate voltage of −5V, and on state current Ion is at least 4 $\mu$A at a gate voltage of 20V. Thus, Ion may be satisfactory but Ioff may be too large.

However, Ioff can be decreased if a hydrogen ($H_2$) plasma treatment is performed before the passivation layer is deposited. While not wishing to be bound by any theory of operation, it appears that a thin conductive film is formed on the exposed surface of the undoped amorphous silicon layer (channel region) due to ion diffusion of molybdenum and tungsten, formation of silicide or re-deposition of the byproduct of the etched metal after etching the doped amorphous silicon layer. This conductive film appears to be removed or diluted during the $H_2$ plasma treatment to improve the surface characteristics of the channel region.

The characteristics of the TFT may be further improved if helium (He) plasma treatment, preferably in situ He plasma treatment, is performed.

Figure 16:
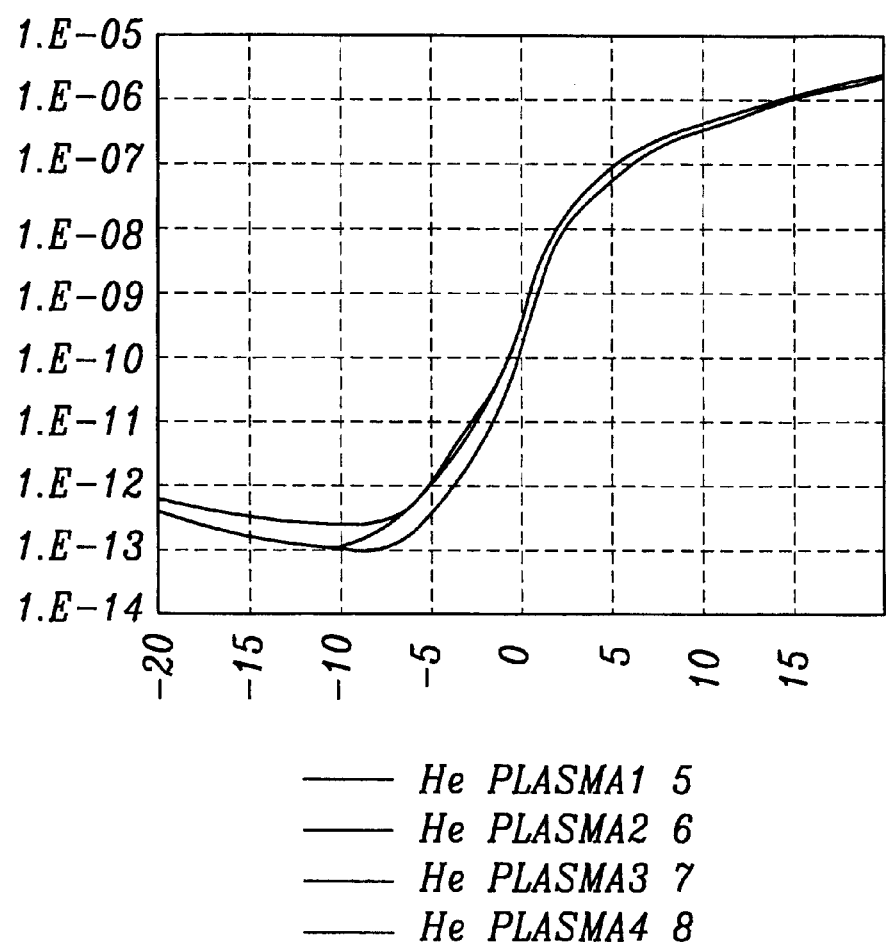
FIG. 16 is a graph illustrating I–V characteristics of a TFT after a helium (He) plasma treatment.

FIG. 16 is a graph illustrating the I–V characteristics of an He plasma treated TFT. As shown in FIG. 16, Ioff may be decreased by the same amount as the case applying the $H_2$ plasma treatment, so that Ioff is equal to or less than 1 pA. Moreover, Ion is not decreased, in contrast with the case applying an $H_2$ plasma treatment.

If $CF_4$+HCl is used, large amounts of the fluorocarbon polymer are formed to protect the metal pattern and the silicon layer is etched by fluorine radicals. Therefore, the fluorocarbon polymer film should be removed to prevent the characteristics of the TFT from degrading. To remove the fluorocarbon polymer film, the hardened polymer during the etching process may be softened and a cleaning and annealing process may be performed. The results shown in FIG. 16 demonstrate this fact.

Figure 17:
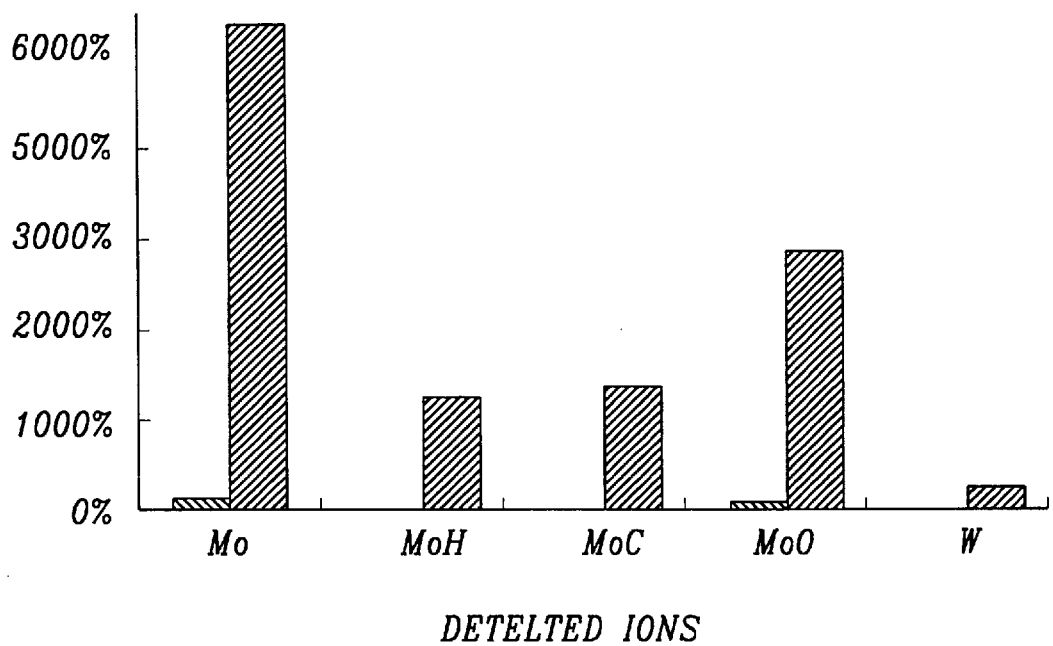
FIG. 17 is a graph showing the kinds and amounts of ions detected during a manufacturing process according to the first embodiment of the present invention.

FIG. 17 is a graph showing the kinds and amounts of ions detected during a manufacturing process according to the first embodiment of the present invention. As shown in FIG. 17, large numbers of Mo ions are detected and compounds such as MoO, MoH, MoC are detected. The compounds are formed to protect the data pattern and may cause the degradation of the characteristics of the TFT.

Figure 8A:
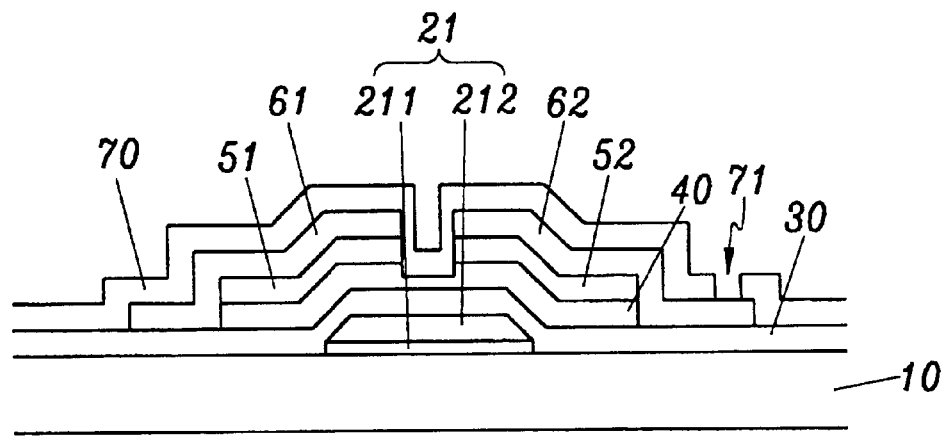
Figure 8B:
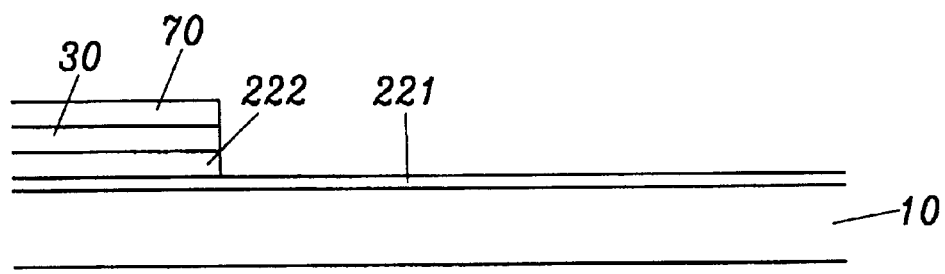
Figure 8C:
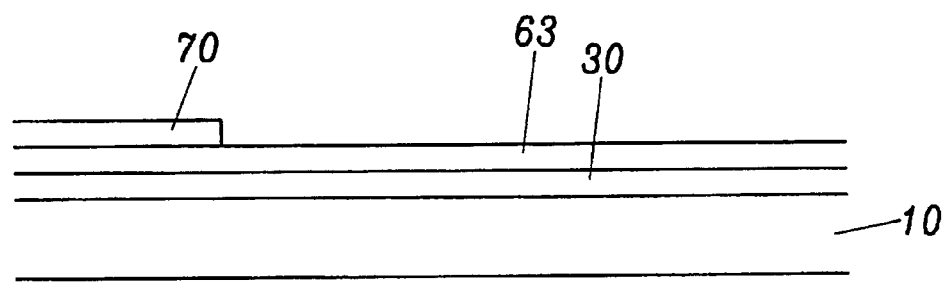

Next, as shown in FIGS. 8A–8C, a passivation layer 70 is deposited and photo-etched with the gate insulating layer 30 using a fourth mask to form a contact hole 71 exposing the drain electrode 62. The gate pad 22 and the data pad 63 are also exposed. The upper layer 222 of the gate pad 22 made of aluminum-neodymium alloy is removed to expose the lower layer 221 made of chromium because the aluminum alloy may not be desirable for a pad.

Finally, as shown in FIGS. 2–4, an ITO layer is deposited and dry etched using a fifth mask to form a pixel electrode 80 connected to the drain electrode 62 through the contact hole 71. An ITO electrode 81 for a gate pad and an ITO electrode 82 for a data pad, which are connected to the gate pad 22 and the data pad 63 respectively, are also formed. If the molybdenum alloy is used for the upper layer of the gate pad 22, the upper layer need not be removed.

Figure 18:
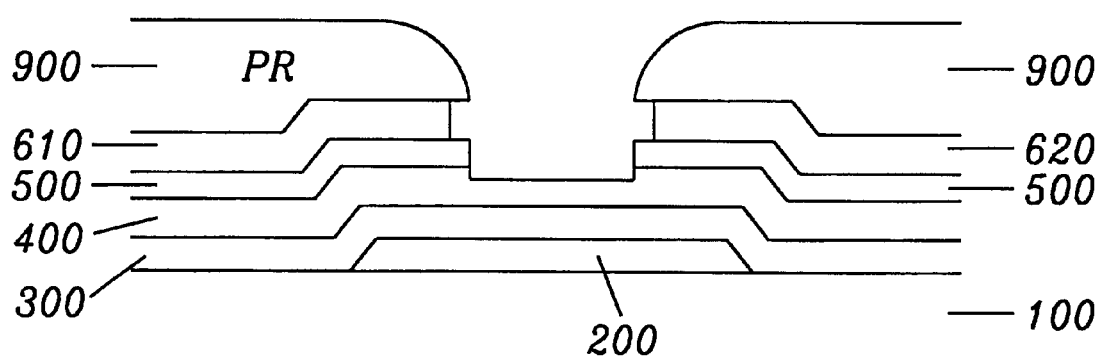
FIG. 18 shows a cross-sectional view of a TFT substrate illustrating a manufacturing method according to a second embodiment of the present invention.

In a second embodiment of the present invention, the doped amorphous silicon layer may be etched using the photoresist pattern as an etch mask. The photoresist pattern is stripped and the in site He plasma treatment is performed. FIG. 18 shows a cross sectional view of a TFT substrate illustrating a manufacturing method according to a second embodiment of the present invention.

As shown in FIG. 18, a molybdenum alloy layer is etched using a photoresist (PR) pattern 900 as a mask to form source and drain electrode 610, 620. Without stripping the photoresist pattern 900, a doped amorphous silicon layer 500 is dry etched using the photoresist pattern as a mask to reduce or prevent the source and the drain electrodes 610, 620 from being consumed during the etching process. The HCl+$SF_6$ gas system is used as the dry etching gas.

Because the photoresist pattern 900 is not removed, the source/drain electrodes are not etched under the photoresist pattern 900. However, as shown, the side walls of the source and the drain electrodes 610, 620 may be partially etched to form a step-like pattern between the source/drain electrodes and the doped amorphous silicon layer 500.

According to the second embodiment of the present invention, an ashing process using $O_2$ gas may be added to remove the hardened photoresist 900. In situ He plasma treatment is performed after the ashing process.

FIG. 19 is a table showing manufacturing methods according to the second embodiment and the etch rates of the doped amorphous silicon layer. FIG. 20 is a table showing the results of an EDS (electric data system) test of a TFT formed according to the condition shown in FIG. 19. An EDS test may be used to evaluate the characteristics and performance of the panel by measuring the electrical characteristics, i.e., Ioff, Ion, Vth, gradient, resistance, capacitance after manufacturing the panel, at the test element group (TEG) region.

Ioff is the current passing through the drain electrode when the gate voltage is −5V and the source/drain voltage is 10V. Smaller values are preferable. Ion is the current passing through the drain electrode when the gate voltage is 20V and the source/drain voltage is 10V. Larger values are preferable. Vth is the threshold voltage and gradient is the slope of the line to calculate the threshold voltage. Using the values described above, the mobility can be calculated. FIG. 21 is a table showing the mobility calculated using the EDS data according to the second embodiment.

As shown in FIG. 19, Condition 1 is the case that the photoresist pattern on the data pattern is stripped before etching the doped amorphous silicon layer and He plasma treatment is performed after etching the doped amorphous silicon layer. In this case, the etched thickness of the doped amorphous silicon layer was about 1,283 Å. In Conditions 2 and 3, photoresist pattern on the data pattern is stripped first and the doped amorphous silicon layer is etched using $CF_4+HCl$. To investigate the change of the characteristics of the TFT, ashing is performed (Condition 2) or ashing and in situ He plasma treatment are performed (Condition 3). In these two cases, the etched thickness of doped amorphous silicon layer was about 1,289 Å.

In Conditions 4–6, the doped amorphous silicon layer is etched using the photoresist pattern that forms the source/drain electrodes as a mask. In Condition 4, after etching the doped amorphous silicon layer, the $O_2$ ashing is performed, and the He plasma treatment is skipped. In that case, the etched thickness of the doped amorphous silicon layer was about 1,154–1,167 Å. In Condition 5, the doped amorphous silicon layer is etched using $CF_4+HCl$ gas, ashing is performed and $H_2$ plasma treated, and the doped amorphous silicon layer was etched about 1,166 Å. Finally, in Condition 6, the doped amorphous silicon layer is etched using $CF_4+HCl$ gas, ashing and in situ He plasma treatment are performed, and the doped amorphous silicon layer was etched about 1,114–1,211 Å.

As shown in FIG. 20, off state currents are equal to or less than 1 pA except in Condition 4. Condition 6, where in situ He plasma treatment is performed, has the best on state current characteristic, while Ion is 4 μA. Threshold voltages Vth are relatively low in Conditions 3 and 6, where He plasma treatment is performed. The gradient increases from Condition 1 to Condition 6. The contact resistances are lower in Conditions 1–3, where the photoresist pattern is removed first compared with in Conditions 4–6, where the doped amorphous silicon layer is etched using the photoresist pattern as a mask. In contrast, source/drain resistances are lower in Conditions 4–6, where the doped amorphous silicon layer is etched using the photoresist pattern as a mask compared with in Conditions 1–3 that the photoresist pattern is removed first.

The mobility can be calculated by the following equations:

$$Mobility=(2*(grad)^2*L)/(W*Cj),$$

where L and W are the length and the width of the channel of the TFT respectively. As shown in FIG. 21, the critical dimension of the gate electrode after cleaning inspection is 9.231 μm in Conditions 1–3, and 9.095 μm in Conditions 4–6. The width of the source/drain electrode is 8.847 μm. Cj is the capacitance per unit area. The designed width and the length of the channel of the TFT are 14 μm and 3.5 μm respectively. The actual width and the length of the channel are 12.847 μm and 4.653 μm respectively in Conditions 1–3, 12.870 μm and 4.630 μm respectively in Conditions 4–6.

As shown in FIG. 21, the calculated mobility has a maximum value in Condition 6. The mobility is 0.937–0.961. This results is very similar to the results in the EDS test shown in FIG. 20. Accordingly, the doped amorphous silicon layer is etched using the data pattern or the photoresist pattern and in situ He plasma treatment is performed to decrease the Ioff current while maintaining the Ion characteristics.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of manufacturing a thin film transistor comprising the steps of:

forming on a substrate, a gate electrode, a gate insulating layer on the gate electrode, an undoped amorphous silicon layer on the gate insulating layer, first and second spaced apart doped amorphous silicon layers on the undoped amorphous silicon layer that define an exposed portion of the undoped amorphous silicon layer, a first electrode on the first doped amorphous silicon layer and a second electrode on the second doped amorphous silicon layer; and performing plasma treatment on the exposed portion of the undoped amorphous silicon layer.

2. A method according to claim 1 wherein the performing step is followed by the step of:

forming a passivation layer on the first and second electrodes and on the plasma treated exposed portion of the undoped amorphous silicon layer.

3. A method according to claim 1 wherein the performing step comprises the step of performing hydrogen plasma treatment on the exposed portion of the undoped amorphous silicon layer.

4. A method according to claim 1 wherein the performing step comprises the step of performing helium plasma treatment on the exposed portion of the undoped amorphous silicon layer.

5. A method according to claim 4 wherein the performing step comprises the step of performing in-situ helium plasma treatment on the exposed portion of the undoped amorphous silicon layer.

6. A method according to claim 1 wherein the forming step comprises the steps of:

forming a doped amorphous silicon layer on the undoped amorphous silicon layer;

forming the first and second electrodes on the doped amorphous silicon layer; and dry etching the doped amorphous silicon layer using the first and second electrodes as an etch mask, to form the first and second spaced apart doped amorphous silicon layers on the undoped amorphous silicon layer that define the exposed portion of the undoped amorphous silicon layer.

7. A method according to claim 6 wherein the first and second electrodes comprise molybdenum or molybdenum-tungsten alloy.

8. A method according to claim 7 wherein the dry etching step comprises the step of dry etching the doped amorphous silicon layer using $CF_4$ and HCl gasses.

9. A method according to claim 6 wherein the step of forming the first and second electrodes comprises the steps of:

forming a conductive layer on the doped amorphous silicon layer;

forming a photoresist pattern on the conductive layer;

etching the conductive layer using the photoresist pattern as an etch mask to form the first and second electrodes; and stripping the photoresist pattern.

10. A method according to claim 1 wherein the forming step comprises the steps of:

forming a doped amorphous silicon layer on the undoped amorphous silicon layer;

forming a conductive layer on the doped amorphous silicon layer;

forming a photoresist pattern on the conductive layer;

etching the conductive layer using the photoresist pattern as an etch mask to form the first and second electrodes;

dry etching the doped amorphous silicon layer using the photoresist pattern as an etch mask, to form the first and second spaced apart doped amorphous silicon layers on the undoped amorphous silicon layer that define the exposed portion of the undoped amorphous silicon layer; and stripping the photoresist pattern.

11. A method according to claim 10 wherein the first and second electrodes comprise molybdenum or molybdenum-tungsten alloy.

12. A method according to claim 11 wherein the dry etching step comprises the step of dry etching the doped amorphous silicon layer using $CF_4$ and HCl gasses.

13. A method of manufacturing a liquid crystal display comprising the steps of:

forming on a substrate, a plurality of spaced apart gate lines, an array of gate electrodes, a respective one of which extends from one of the gate lines, a gate insulating layer on the gate electrodes, an undoped amorphous silicon layer on the gate insulating layer, an array of first and second spaced apart doped amorphous silicon layers on the undoped amorphous silicon layer, a respective pair of which define an array of exposed portions of the undoped amorphous silicon layer, an array of spaced apart data lines that intersect the array of spaced apart gate lines, an array of source electrodes, a respective one of which is on a respective first doped amorphous silicon layer and is connected to one of the data lines, and an array of drain electrodes, a respective one of which is on a respective second doped amorphous silicon layer; and performing plasma treatment on the array of exposed portions of the undoped amorphous silicon layer.

14. A method according to claim 13 wherein the performing step is followed by the step of:

forming a passivation layer on the array of source electrodes, on the array of drain electrodes and on the array of plasma treated exposed portions of the undoped amorphous silicon layer.

15. A method according to claim 13 wherein the performing step comprises the step of performing hydrogen plasma treatment on the array of exposed portions of the undoped amorphous silicon layer.

16. A method according to claim 13 wherein the performing step comprises the step of performing helium plasma treatment on the array of exposed portions of the undoped amorphous silicon layer.

17. A method according to claim 16 wherein the performing step comprises the step of performing in-situ helium plasma treatment on the array of exposed portions of the undoped amorphous silicon layer.

18. A method according to claim 13 wherein the forming step comprises the steps of:

forming a doped amorphous silicon layer on the undoped amorphous silicon layer;

forming an array of first and second spaced apart electrodes on the doped amorphous silicon layer; and dry etching the doped amorphous silicon layer using the array of first and second electrodes as an etch mask, to form the array of first and second spaced apart doped amorphous silicon layers on the undoped amorphous silicon layer that define the array of exposed portions of the undoped amorphous silicon layer.

19. A method according to claim 18 wherein the step of forming an array of first and second spaced apart electrodes comprises the steps of:

forming a conductive layer on the doped amorphous silicon layer;

forming a photoresist pattern on the conductive layer;

etching the conductive layer using the photoresist pattern as an etch mask to form the array of first and second spaced apart electrodes; and stripping the photoresist pattern.

20. A method according to claim 18 wherein the forming step comprises the steps of:

forming a doped amorphous silicon layer on the undoped amorphous silicon layer;

forming a conductive layer on the doped amorphous silicon layer;

forming a photoresist pattern on the conductive layer;

etching the conductive layer using the photoresist pattern as an etch mask to form the array of first and second spaced apart electrodes;

dry etching the doped amorphous silicon layer using the photoresist pattern as an etch mask, to form the array of first and second spaced apart doped amorphous silicon layers on the undoped amorphous silicon layer that define the array of exposed portions of the undoped amorphous silicon layer; and stripping the photoresist pattern.

* * * * *